United States Patent [19]
Kober

[11] Patent Number: 5,144,534
[45] Date of Patent: * Sep. 1, 1992

[54] METHOD FOR MANUFACTURING RIGID-FLEXIBLE CIRCUIT BOARDS AND PRODUCTS THEREOF

[76] Inventor: Horst Kober, Berggewann 5, 6940 Weinheim, Fed. Rep. of Germany

[*] Notice: The portion of the term of this patent subsequent to Aug. 25, 2009 has been disclaimed.

[21] Appl. No.: 650,482

[22] Filed: Feb. 5, 1991

[30] Foreign Application Priority Data

Feb. 5, 1990 [DE] Fed. Rep. of Germany ....... 4003344

[51] Int. Cl.$^5$ .......................... H05K 1/00; H05K 3/02
[52] U.S. Cl. ...................................... 361/398; 29/846; 29/852; 174/254; 156/631
[58] Field of Search .................. 29/846, 852; 361/398, 361/412, 413; 174/254; 156/630, 631, 901

[56] References Cited

U.S. PATENT DOCUMENTS

| | | |
|---|---|---|
| 4,533,787 | 8/1985 | Anderegg et al. |
| 4,715,928 | 12/1987 | Hamby ................. 29/846 |
| 4,931,134 | 6/1990 | Hatkevitz et al. ........... 29/846 |
| 5,004,639 | 3/1991 | Desai ...................... 361/398 |
| 5,013,397 | 5/1991 | Tsukakoshi ............. 29/846 |

FOREIGN PATENT DOCUMENTS

| | | |
|---|---|---|
| 2657212A1 | 6/1978 | Fed. Rep. of Germany . |
| 3119884C1 | 11/1982 | Fed. Rep. of Germany . |
| 3624718C2 | 1/1988 | Fed. Rep. of Germany . |
| 8872 | 1/1979 | Japan .................... 29/846 |

Primary Examiner—P. W. Echols
Attorney, Agent, or Firm—Kenyon & Kenyon

[57] ABSTRACT

A method for manufacturing rigid-flexible multilayer printed circuit boards and the products thereof. The method comprises the compression molding several layers of materials comprised of a rigid layer, a separation layer, a flexible insulating layer, adhesives, and conductive metal to form a laminate. Flexibility is provided in the printed circuit board by slots in the rigid layer which define the flexible region, the application of flexible insulating material over the defined flexible region, and the removal of the rigid material which occupied the defined flexible region (plug). As disclosed by the present method, a flexible insulating layer is provided in the flexible regions only without the use of preliminary laminates. This method does not require the use of pressure equalizing cushions and does not result in relief formation on an upper layer of conductive metal during compression molding. After forming the composite laminate, it may be shaped as desired, and plated through holes may be provided in the rigid layer by known techniques.

35 Claims, 2 Drawing Sheets

FIG. 3
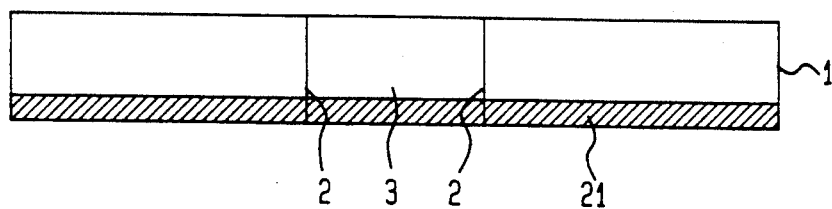
FIG. 4
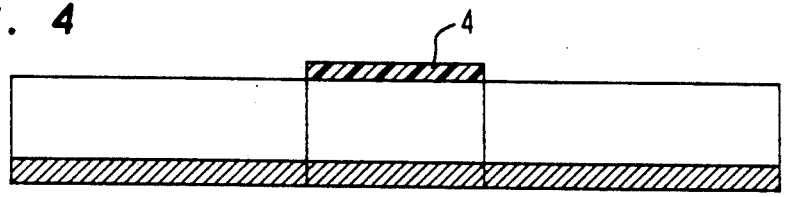
FIG. 5
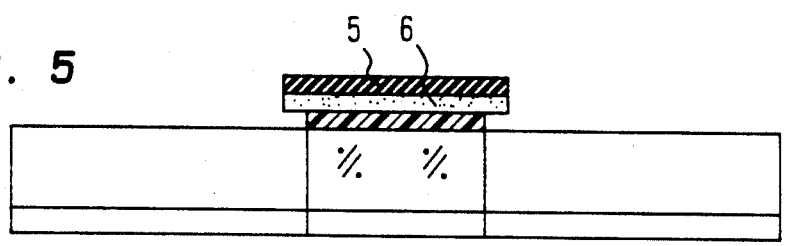
FIG. 6
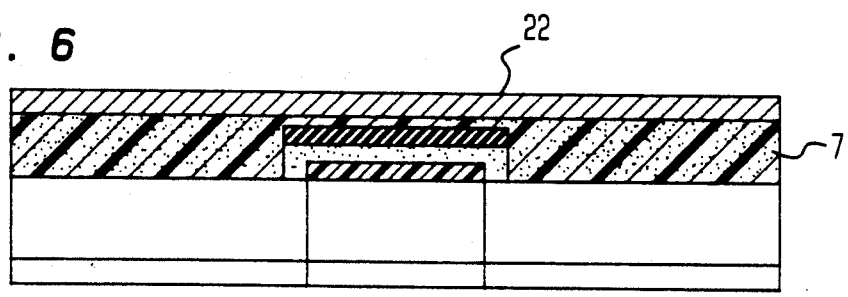
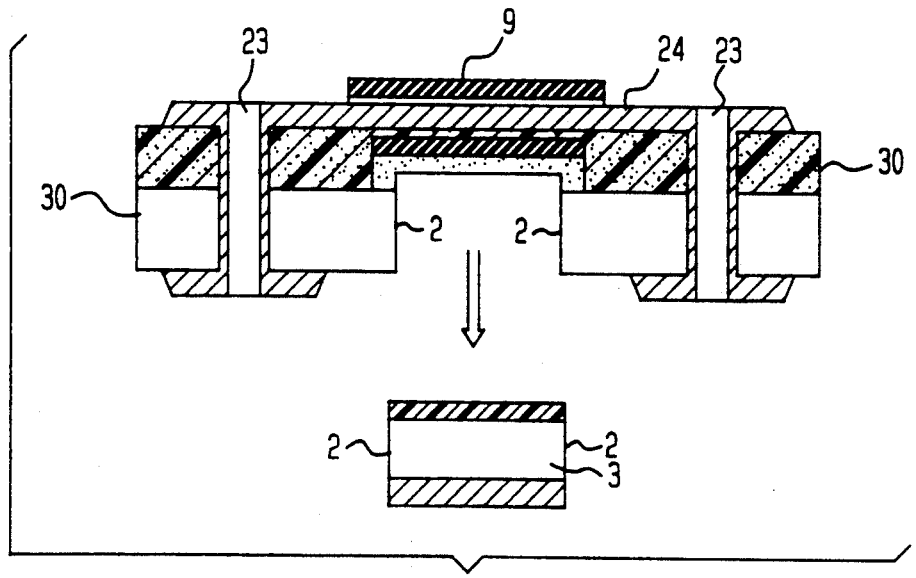
FIG. 7

METHOD FOR MANUFACTURING RIGID-FLEXIBLE CIRCUIT BOARDS AND PRODUCTS THEREOF

The present invention relates to a method for manufacturing rigid-flexible printed circuit boards having flexible regions defined by a flexible insulating material bonded to a rigid region.

BACKGROUND OF THE INVENTION

Printed circuit boards are well known and have numerous applications. Printed circuits are used in almost all types of electronic equipment ranging from radio and television sets, telephone systems units, automobile electronic wiring, guided-missile and airborne electronic equipment, computers, and industrial control equipment. The printed circuit board has evolved from one-sided printed circuit boards to two-sided through-connected printed circuit boards, to multilayer circuitry, and to flexible circuitry.

Flexible printed circuits are useful in applications where flexing is a functional requirement, such as where flexing facilitates assembly and disassembly, or other dimensional variations need to be accommodated. Conventional flexible circuit materials include the flexible plastic films KAPTON, NOMEX, and TEFLON (trademarks of Du Pont). These materials provide flexibility, stability, and heat resistance, and are bondable to copper sheets for the formation of a printed circuit board, and to themselves to provide an insulating layer for the printed circuit and/or to facilitate the construction of multilayer boards.

Multilayer printed circuit boards increase the available surface area in an available space for the mounting of circuits and circuit parts. Conventional multilayer circuit boards comprise of a number of boards having etched copper foil circuits disposed thereon, separated by an insulating layer, e.g., prepreg, laminated or compression molded together under controlled temperature, pressure, and time. The circuits defined by the various conductor layers are connected by through holes and connection holes which are drilled and plated by traditional methods.

Rigid-flexible circuit boards are generally composed of separate rigid and flexible layers which are bonded together. The separate layers are either rigid or flexible insulating substrates which can be provided on one or both sides with a copper laminate (circuit). The shape of the rigid layers defines the rigid area of the printed circuit board. The flexible layers are, therefore, defined by the shape of the rigid layer. The flexible regions of the printed circuit board join the rigid regions of the circuit together or provide flexible connections to external assemblies. Electrical connection between the copper layers is provided by plated through holes.

German Patent DE 36 24 718 describes a rigid-flexible printed circuit board which has flexible regions constructed with flexible, adhesive coated plastic layers. These layers are free of peripheral gaps. When the individual layers are manufactured, a tool is used to punch or cut notches in preimpregnated boards (prepregs). These notches are somewhat larger than the desired flexible region of the printed circuit board. Plastic layers, which have been similarly prepared, are inserted into the prepregs. The thickness of the prepregs is the same as the thickness of the plastic layer. Copper foil is applied on the top and bottom of a preliminary laminate to form a composite. This composite is compression molded. Printed circuit patterns are subsequently etched in the copper foils.

U.S. Pat. No. 4,715,928 describes a method for manufacturing single layer rigid-flexible printed circuit boards. These printed circuit boards include one layer of printed circuit. The use of flexible polyimide films, possibly precoated with glue, to provide the desired flexible region in the finished printed circuit board is disclosed. The flexible film may be bonded to the rigid region through the use of prepregs.

A rigid-flexible printed circuit board which has defined regions of mechanically laid wire conductors is disclosed by U.S. Pat. No. 4,533,787. This printed circuit board is provided with slots which define flexible regions. The slots may be cut so as to provide for cross-pieces in the slots. The slots are introduced before application of a flexible film. Ultimately, the region surrounded by the slots is removed.

U.S. Pat. No. 4,533,787 also discloses that a composite film, which does not act as an insulating film, may be situated in the slots. The composite comprises a thermoplastic layer between two sheets of non-adhesive separator film (sold under the trade name CONTIFLEX CONFORMAL COATING). The thermoplastic layer flows into the slots during compression molding to prevent other layers which lie above it from sagging into the slot.

German Patent DE 31 19 884 is directed to a method for manufacturing rigid-flexible printed circuit boards. This method employs a bonding foil arranged on a flexible layer, and a sheet-metal plate coated, e.g., by spraying, with liquid polytetrafluoroethylene. The contour of the sheet-metal plate corresponds to the form of the planned flexible regions. The flexible layer is compression molded with the rigid layer in the area of the bonding foil to form a composite. Printed circuits are formed on the rigid layer. Slots are provided in the composite. A section of the rigid layer may be removed together with the sheet-metal plate.

German Patent DE 26 57 212 relates to a method for producing composite rigid-flexible printed circuit boards having two or more insulating individual layers. The printed circuit boards have adjacent rigid and flexible areas made by pressing together separate rigid and flexible insulating layers with the aid of bonding sheets. Portions of the rigid layer may be removed to provide the desired flexible areas. This method discloses flexible layers that cover the entire printed circuit board.

German Patent DE 26 57 212 discloses a rigid-flexible printed circuit board having slots introduced on a side turned toward a flexible layer before compression molding. The slots define flexible and rigid regions of the printed circuit board. The depth of the slots may correspond to approximately one-half the thickness of the rigid material. After compression molding and formation of printed circuits on the external surfaces, additional slots may be produced in a similar manner but on the opposite side of the rigid layer. The rigid layer occupying the desired flexible regions can be removed along the separating lines of the slots.

The German Patent DE 26 57 212 discloses rigid-flexible printed circuit boards that use adhesive layers which flow during compression molding. Since the material within the slots must eventually be removed, isolating foils are used to prevent the adhesive agent from flowing onto the material which is located in the flexible region. The plastic films used for the flexible layers in these printed circuit boards may be hygroscopic, so that when the circuit arrangement is soldered, delaminations can occur between the flexible and the rigid layers due to the vaporization of absorbed moisture.

Generally, it is also possible to use a non-flowing adhesive agent between the rigid and flexible single layers of rigid-flexible printed circuit boards. The viscosity of the non-flowing adhesive agent is such that it does not flow into the flexible areas during compression molding. Thus, the areas of bonding by the non-flowing adhesive can be controlled. These types of adhesive agents, however, require the application of a known pressure-equalizing cushion during compression molding in order to attain a homogeneous bonding of the flexible and rigid single layers. When circuit-board conductors are also present on a rigid single layer that is located in the interior of a multilayer printed circuit board, this cushion may cause the printed circuit to press into the flexible single layer. The result is a relief formation on the flexible single layer which in turn causes a relief formation on the copper foil applied to the outer flexible layer. Thus, the manufacture of circuit-board conductors on this copper foil using etching techniques is more difficult.

SUMMARY AND OBJECTS OF THE INVENTION

It is an object of the present invention to provide a simple method for manufacturing a printed circuit board having single or multiple layers of printed circuits and which also has both rigid and flexible regions.

It is also an object of the present invention to provide a method for manufacturing a rigid-flexible single or multilayer printed circuit board that involves application of flexible insulating material only in flexible regions of the circuit board and without requiring rigid-flexible preliminary laminates.

It is a further object of the present invention to provide a method for manufacturing a rigid-flexible single or multilayer printed circuit board that does not require the application of pressure equalizing cushions, and does not result in relief formation in an outer layer of conductive metal during compression molding.

It is another object of the present invention to provide a method for manufacturing a rigid-flexible single or multilayer printed circuit board where the type of adhesive used in the rigid and flexible regions is not limited to prepregs, and where the thickness of the rigid layer may be determined independently of the thickness of the flexible regions.

It is another object of the present invention to provide a method for manufacturing a rigid-flexible single or multilayer printed circuit board where the type of adhesive used to bond the conductive metal to the rigid-flexible substrate may be a liquid adhesive.

The invention provides for a method for making a rigid-flexible circuit board and products thereof, comprising the steps of, forming a slot which defines a removable plug in a rigid circuit board, the board comprising a rigid layer disposed to one or between two conductive layers; applying a separation layer to the plug; forming a bonded region between a flexible insulating layer and the rigid circuit board that does not prevent removal of the plug; applying a prepreg to the circuit board on the same side as the flexible insulating layer, wherein the prepreg does not cover the flexible insulating layer; applying a third conductive layer to a surface defined by exposed portions of the circuit board, the flexible insulating layer, and the prepreg to form a composite A; and removing the plug to form a flexible region in the rigid circuit board.

BRIEF DESCRIPTION OF THE DRAWINGS

FIGS. 3 to 7 are views illustrating the various steps of a process for fabricating a rigid-flexible single printed circuit board in accordance with this invention.

DETAILED DESCRIPTION OF THE INVENTION

Figure 1:
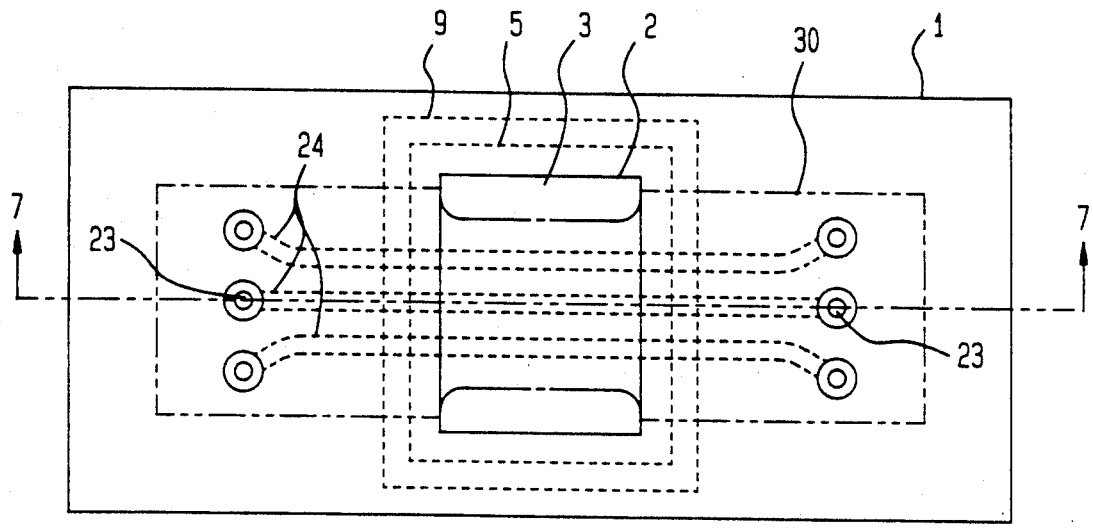
FIG. 1 is a top plan view of a rigid-flexible printed circuit board before contouring.
Figure 2:
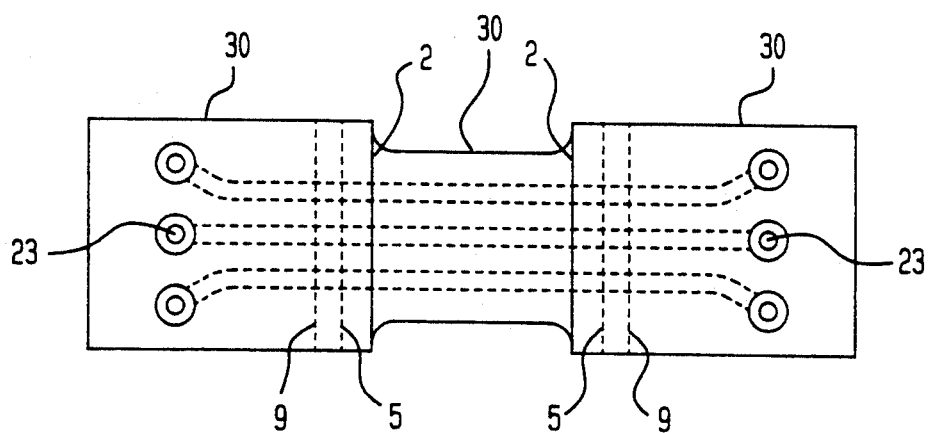
FIG. 2 is a top plan view of the completed rigid-flexible printed circuit board.

The method according to the invention begins with a single rigid layer (1), preferably a glass-fiber reinforced epoxy resin. One or two conductive layers, preferably copper, are applied to this rigid layer (1). If two conductive layers are applied, then they are applied on opposing sides of the rigid layer and a circuit may be provided in at least one surface to produce a rigid circuit board.

Slots (2) are cut in the rigid circuit board. These slots (2) define a plug (3) that is later removed to form a flexible region in the rigid circuit board. The slots (2) are provided before compression molding and pass through the entire thickness of the rigid circuit board. The slots (2) are fashioned, e.g., as rupture joints, so as to hold the plug (3) in place until removal is desired. These slots (2) can be produced using known techniques, e.g., milling. By following the disclosed method one can avoid the risk of damaging the flexible insulating layer (5) which may result when the slots (1) are made after compression molding.

After the slots (2) are cut, a separation layer (4) is applied to the rigid circuit board over an exposed surface area of the plug (3). The separation layer (4) may be applied as a liquid or solid and is preferably temperature resistant up to 200° C. The separation layer (4) may be a polytetraflouroethylene, applied in liquid or solid form, or a polyethylene which may be applied, e.g., by screen printing.

The flexible insulating layer (5), which may be a polyimide, an aramide fabric, or an aramide fabric treated with an adhesive, is applied to the rigid circuit board. If two conductive layers have been applied to the rigid layer (1), then the flexible insulating layer (5) is applied to the rigid circuit board on the circuit side of the board. If only one conductive layer is applied to the rigid layer (1), then the flexible insulating layer (5) is applied to the side opposing the conductive layer. The flexible insulating layer (5) is situated so that it covers the plug (3). The flexible insulating layer (5) extends over the slot (2) to form an overlap with rigid layer (1). The overlap of the flexible insulating layer (5) forms a bonding region with the rigid circuit board but does not prevent the removal of the plug (3). The bonding region has a width about 3 to 5 mm on all sides of the slot (2).

The flexible insulating layer (5) is attached to the rigid layer (1) with an adhesive (6). The region between the rigid layer (1) and flexible insulating layer (5) to which the adhesive (6) is applied defines the bonding region. Preferably, the bonds are introduced between the area of the overlapping flexible insulating layer (5) and the underlying rigid circuit board only.

As mentioned above, the flexible insulating layer (5) may be comprised of a reinforced fabric, such as an aramide-bonded fabric, which is treated with the adhesive. A fiber reinforced flexible insulating layer may add a degree of dimensional stability and tear resistance.

Continuous adhesive film (7) or a prepreg which may be a glass-fiber reinforced epoxy resin, is subsequently applied so to cover the rigid layer on the side to which the flexible insulating layer has been applied to form a composite A. The continuous adhesive film (7) or prepreg is preferably at least about one micrometer thicker than the combined thickness of the flexible insulating layer (5) and adhesive layer (6).

Continuous adhesive film (7), which may have the same resinous composition as the rigid layer (1), is subsequently applied so to cover the rigid circuit board on the side to which the flexible insulating layer (5) has been applied to form a composite A. The continuous adhesive film (7) does cover the flexible insulating layer (5). The continuous adhesive film (7) may have thickness at least 1 micrometer greater than the thickness of the flexible insulating layer (5), combined with the adhesive layer (6).

An outer conductive layer (22), preferably copper, is applied over the continuous adhesive film side of the composite A to form a composite B. Adhesive does not need to be applied to the outer conductive layer (22), however it may be advantageous to apply the continuous adhesive film (7) to the conductive layer (22) prior to its application. Bonding to the composite is effected by the continuous adhesive film (7).

The composite B is then compression molded into a laminate under sufficient pressure and temperature, e.g., 15 bar and 175° C. to activate the adhesive layers. At the beginning of the compression molding, the continuous adhesive film (7) since it has low viscosity surrounds the flexible insulating layer (5), in a manner that is free of air, on the rigid circuit board. The adhesive layers (6 and continuous adhesive film (7)) bonds all the layers together.

During compression molding, the duration of the continuous adhesive film's (7) flow is short and the continuous adhesive film (7) produces a pressure-equalizing effect. This characteristic enables one to dispense with conventional pressure-equalizing cushions during the compression molding. Thus, this method produces a flat laminate with a smooth conductive layer surface (22).

The continuous adhesive film or the prepreg (7) may also serve as an insulating layer. The continuous adhesive film (7) provides a levelling compensation relative to the thickness of the flexible insulating layer (5). Thus, another advantage of the present invention is that no limitation is placed on thickness of either the rigid or flexible regions when designing the rigid-flexible printed circuit boards. The thickness of the rigid layer (1) does not have to be adapted to the thickness of the flexible insulating layer (5) in the flexible region. Rather, the thickness of the rigid layer (1) can be determined based on the requirements of any component parts in the rigid region and independently of the dimension of the flexible insulating layer (5).

The region of the rigid circuit board covered by the flexible insulating layer (5), i.e., plug (3), is then removed. Its removal is facilitated by the previously introduced slots (2). Removal of the plug (3) may be further facilitated by first providing a contour (30) to the board.

Plated through-holes (23) in the rigid regions and printed circuitry (24) in the conductive metal of the upper layer may be provided in the assembly using known methods for rigid multilayer printed circuit boards.

Optionally, an additional flexible insulating layer (9) may be applied to the assembly for increased mechanical strength and/or insulation. The region covered by the additional flexible insulating layer (9) is essentially that of the flexible regions of the circuit board.

Rigid-flexible circuit boards produced by the disclosed method may be combined employing adhesive layers and compression molding to form a rigid-flexible multilayer circuit board.

What is claimed is:

1. A method for making rigid-flexible circuit boards, comprising the steps of:
    (a) forming a slot which defines a removable plug in a rigid circuit board, the board comprising a rigid layer disposed to one or between two conductive layers;
    (b) applying a separation layer to the plug;
    (c) forming a bonded region between a flexible insulating layer and the rigid circuit board that does not prevent removal of the plug;
    (d) applying a continuous adhesive film or a prepreg to the circuit board on the same side as the flexible insulating layer;
    (e) applying an outer conductive layer to the surface defined by the flexible insulating layer and the continuous adhesive film or prepreg to form a composite A; and
    (f) removing the plug to form a flexible region in the rigid circuit board.

2. The method of claim 1 wherein the slot comprises a rupture joint.

3. The method of claim 1 wherein the separation layer is temperature resistant to about 200° C.

4. The method of claim 1 wherein the separation layer comprises polytetraflouroethylene.

5. The method of claim 4 wherein the polytetraflouroethylene may be applied as a liquid or solid.

6. The method of claim 1 wherein the separation layer comprises polyethylene.

7. The method of claim 6 wherein the polyethylene may be screen printed.

8. The method of claim 1 wherein the flexible insulating layer comprises polyimide.

9. The method of claim 1 wherein the flexible insulating layer comprises an adhesive reinforced with fabric.

10. The method of claim 9 wherein the fabric comprises an aramide fabric.

11. The method of claim 1 wherein the slot may be milled.

12. The method of claim 1 wherein the flexible insulating layer is bonded to the circuit board with an adhesive.

13. The method of claim 12 wherein the bonded region has a width of 3 to 5 mm on all sides of the slot.

14. The method of claim 12 wherein the continuous adhesive film or the prepreg has a thickness of at least 1 micrometer greater than the flexible insulating layer combined with the adhesive.

15. The method of claim 14 further comprising the step of compression molding the composite A to form a laminated composite B.

16. The method of claim 15 further comprising the step of providing electrical communication between the conductive layers.

17. The method of claim 16 wherein the electrical communication is comprised of through holes.

18. The method of claim 15 further comprising the step of providing a circuit on the outer conductive layer.

19. The method of claim 15 further comprising the step of shaping the laminated composite to facilitate the removal of the plug.

20. The method of claim 15 further comprising the step of applying a second flexible insulating layer to composite B covering a flexible region of board.

21. The method of claim 1 wherein the continuous adhesive film or the prepreg may have the same resinous composition as the rigid layer.

22. The method of claim 1 wherein the prepreg comprises an adhesive bonded fabric impregnated with an unhardened resin.

23. The method of claim 22 wherein the resin comprises epoxy.

24. The method of claim 23 wherein the fabric comprises fiberglass.

25. The method of claim 1 further comprising the step of compression molding the composite A to form a laminated composite B.

26. The method of claim 25 further comprising the step of providing electrical communication between the conductive layers.

27. The method of claim 25 wherein the electrical communication is comprised of through holes.

28. The method of claim 25 further comprising the step of providing a circuit on the third conductive layer.

29. The method of claim 25 further comprising the step of providing a contour to the laminated composite wherein the contour intersects with the slot.

30. The method of claim 25 further comprising the step of applying a second flexible insulating layer to composite B covering a flexible region of board.

31. The method of claim 1 further comprising the step of providing a contour to the composite A wherein the contour intersects with the slot.

32. A method for making a rigid-flexible multilayer printed circuit board, comprising the steps of:
 (a) forming a rupture joint which defines a removable plug in a rigid circuit board, the board comprising a rigid layer of fiberglass reinforced epoxy resin disposed to one or between two conductive layers of copper;
 (b) applying a separation layer of polytetraflouroethylene;
 (c) forming a bonded region between a flexible insulating layer of polyimide and the rigid circuit board that does not prevent removal of the plug, wherein the flexible insulating layer is bonded to the rigid circuit board, with an adhesive, on the circuit side of the board, the bonded region has a width of 3 to 5 mm on all sides.
 (d) applying a continuous adhesive film or a prepreg of epoxy resin to the circuit board on its circuit side, wherein the continuous adhesive film or the prepreg has a thickness at least 1 micrometers greater than the thickness of the flexible insulating layer combined with the adhesive;
 (e) applying an outer conductive layer of copper to a surface defined by exposed portions of the circuit board, the flexible insulating layer, and the continuous adhesive film or the prepreg to form a composite A;
 (f) compression molding the composite A at 175° C. and 15 bar to form a laminated composite B;
 (g) providing plated through holes between the conductive layers;
 (h) providing a circuit in the third conductive layer;
 (i) shaping the laminated composite to facilitate the removal of the plug; and
 (j) removing the plug to form a flexible region in the rigid circuit board.

33. A circuit board, comprising:
 a rigid layer having disposed thereon at least one conductive layer and a removable plug defined by slots in the rigid layer;
 a separation layer disposed on said plug;
 a flexible insulating layer bonded to a side of the rigid layer to form a bonded region, wherein the bonded region of the flexible insulating layer to the rigid layer does not prevent removal of the plug;
 a continuous adhesive layer on the same side as the flexible insulating layer to form a composite; and an outer conductive layer on a surface of said composite.

34. A circuit board of claim 33 wherein bonded region has a width of at least 3 mm.

35. A circuit board of claim 33 wherein the bonded region has a width of 3 to 5 mm.

* * * * *